US005256962A

United States Patent [19]

Munniksma et al.

[11] Patent Number: 5,256,962

[45] Date of Patent: Oct. 26, 1993

[54] METHOD OF TROUBLESHOOTING ELECTRICAL CIRCUITS USING TWIST-ON LIGHT

[76] Inventors: Theodore Munniksma, R.D. 3, Box 45A, Washington, N.J. 07882; Michael J. Codis, 739 Columbus Ave., Phillipsburg, N.J. 08865

[21] Appl. No.: 951,915

[22] Filed: Sep. 28, 1992

Related U.S. Application Data

[63] Continuation of Ser. No. 715,472, Jun. 14, 1991, Pat. No. 5,179,253.

[51] Int. Cl.[5] .......... G01R 19/14

[52] U.S. Cl. .......... 324/133; 174/87; 324/556; 340/654

[58] Field of Search .......... 174/87; 340/654; 324/133, 538, 556

[56] References Cited

U.S. PATENT DOCUMENTS

| | | | |
|---|---|---|---|
| 1,913,155 | 6/1933 | Ferguson | 340/654 |
| 3,328,690 | 6/1967 | Lockie et al. | 324/122 |
| 3,343,153 | 9/1967 | Waehner | 340/252 |
| 3,448,223 | 6/1969 | Thorsman | 174/87 |
| 3,471,784 | 10/1969 | Arndt et al. | 324/126 |
| 3,513,394 | 5/1970 | Tachick | 324/133 |
| 3,524,178 | 8/1970 | Stratton | 340/654 |
| 4,052,664 | 10/1977 | Pohl | 340/654 X |
| 4,152,643 | 5/1979 | Schweitzer, Jr. | 340/654 |
| 4,171,523 | 10/1979 | Parkitny | 340/654 |
| 4,259,545 | 3/1981 | Hayden | 174/139 |
| 4,288,657 | 9/1981 | Swanson | 174/87 |
| 4,531,016 | 7/1985 | Duve | 174/87 |
| 4,584,526 | 4/1986 | Lobastov | 324/133 |
| 4,725,825 | 2/1988 | McLean | 324/133 X |
| 4,794,331 | 12/1988 | Schweitzer, Jr. | 324/133 |
| 5,001,301 | 3/1991 | Marr et al. | 174/87 |
| 5,003,249 | 3/1991 | Bird | 324/538 X |
| 5,179,253 | 1/1993 | Munniksma et al. | 174/87 |

*Primary Examiner*—Morris H. Nimmo
*Attorney, Agent, or Firm*—Abdallah & Muckelroy

[57] ABSTRACT

A lighted wire nut made operable by connection of the ends of an energized wire conductor is used to troubleshoot circuits by detecting a voltage drop with respect to ground when present in the circuit.

3 Claims, 1 Drawing Sheet

METHOD OF TROUBLESHOOTING ELECTRICAL CIRCUITS USING TWIST-ON LIGHT

This application is a continuation of application Ser. No. 07/715,472 filed on Jun. 14, now U.S. Pat. No. 5,179,253.

BACKGROUND OF THE INVENTION

The present invention generally relates to electrical ground flow interrupters. More specifically, this invention relates to twist-on wire connectors of the type widely known in the electrical equipment industry as "wire nuts".

Twist-on wire connectors comprising a hollow plastic shell with a coiled metal spring threadedly attached to the inside surface of the shell are generally known and widely used in the prior art. Twist-on connectors are used to connect two or more wires on the same electrical circuit to either branch off voltage to other locations or to continue the circuit in a junction box. Prior to this invention, no twist-on wire connectors having visual means to indicate voltage across connected wires is disclosed. The prior art also does not disclose the use of lighted wire connectors for visual troubleshooting of electrical circuits.

Visual indicators of the presence or level of voltage in an electrical conductor are known in the prior art. For example, U.S. Pat. No. 4,152,643 to Schweitzer, Jr. discloses a test point cap that selectively mounts to the test point terminal of a cable connector and emits a flashing light in response to the connector being energized by a high voltage alternating current. U.S. Pat. No. 3,328,690 to Lockie et al discloses a glow tube ionized by an electric field to visually indicate voltage in shielded cable. U.S. Pat. No. 4,171,523 to Parkitny discloses a lamp voltage indicator for electric fences. In U.S. Pat. No. 3,343,153 to Waehner there is shown a separable connector for a high voltage electrical power cable having a glow lamp selectively operable to indicate the presence of a voltage drop across the connector.

Other less closely-related visual voltage indicators are shown in the following prior art patents. U.S. Pat. No. 1,913,155 to Ferguson discloses an improved rarefied gas-filled tube for use as an electric potential indicator. U.S. Pat. No. 3,471,784 to Arndt et al discloses a magnetic loop around a conductor within its insulation constituting part of a capacitive voltage divider/voltage pickup for powering a voltage monitor. U.S. Pat. No. 3,513,394 to Tachick discloses an insulated high voltage source for high voltage conductor terminations having a capacitive voltage divider adapted to energize voltage indicating means. In U.S. Pat. No. 3,524,178 to Stratton improvements in a capacitance tap and lamp to indicate voltage in a power cable or cable termination housing are disclosed. U.S. Pat. No. 4,259,545 to Hayden discloses a glow lamp or fluorescent indicator connected to the insulator of an electrical power line.

Lighted twist-on wire connectors provide distinct advantages over the twist-on connectors of the prior art. A particular advantage is the use of lighted twist-on connectors to reduce the time and equipment needed for electrical circuit troubleshooting operations. In the present art troubleshooting operations require the use of voltage meters and other tools to determine if there is a voltage drop across connected wires. A lighted twist-on connector made operable by a voltage across the ends of connected wires permits visual troubleshooting. The absence of voltage in a wire can thus be more quickly isolated to speed up troubleshooting operations.

Lighted twist-on connectors are also useful to monitor machine components, for example the starter. By having a visual indicator of voltage to indicate when the starter is energized, the machine can be operated more safely. Lighted twist-on connectors also permit visual checks on various parts of an engine, electrical assembly and the like.

Therefore, it should be understood from the foregoing that there exists a need in the art for a lighted twist-on wire connector.

SUMMARY OF THE INVENTION

The present invention is a lighted twist-on wire connector comprising a hollow plastic shell having a transparent upper portion, a tapered metal spring threadedly attached to the inside surface of the hollow shell, and a light assembly disposed to the inside of the upper portion of the hollow shell. The light assembly is electrically connected in series between the tapered metal spring and a ground potential lead wire. When the lighted twist-on connector engages ends of energized wires in the tapered spring, the light assembly visually indicates the presence of voltage across the connected wires.

An object of the present invention is to provide a method whereby light signal means indicate a voltage drop across ends of two or more wires with respect to ground.

Another object of the present invention is to provide a method whereby a light signal means is easily connected at various locations in an electrical circuit to indicate a voltage drop with respect to ground.

A further object of this invention is to provide a method wherein twist-on wire connector permits visual troubleshooting.

Another object of this invention is to provide a method which uses a lighted twist-on connector to connect two or more wires with respect to ground on the same electrical circuit to either branch off voltage to other locations or to continue the circuit in a junction box.

A still further object of this invention is to eliminate or reduce the use of meters and meter operations in troubleshooting 120 V–480 V electrical conductors.

These and other objects and advantages of the present invention will be apparent to those skilled in the art from the following description of preferred embodiments, claims and appended drawings.

DESCRIPTION OF PREFERRED EMBODIMENTS

Figure 1:
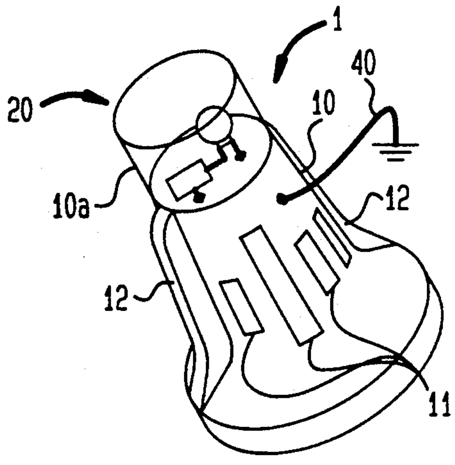
FIG. 1 is a top perspective view of a first embodiment of the lighted twist-on wire connector of the present invention.

In the several drawing figures of the lighted twist-on wire connector like components are indicated by like reference numerals. The preferred embodiments of this invention are illustrative and are not intended as limitations of the invention as claimed.

A perspective view of a first lighted wire connector 1 of the present invention is illustrated in FIG. 1. First lighted wire connector 1 generally comprises a hollow shell 10, preferably formed from plastic material, having a transparent upper portion 10*a*. Finger-gripping means 11 are formed on an outside surface of the lower portion 10*b* of the shell 10 and torquing wings 12 extend laterally from the shell 10 to facilitate twist-on attachment and detachment of the first lighted wire connector 1 to the ends of wires (not shown) as known in the art. A light assembly 20 is disposed to the inside of the transparent upper portion 10*a* of the hollow shell 10.

Figure 2:
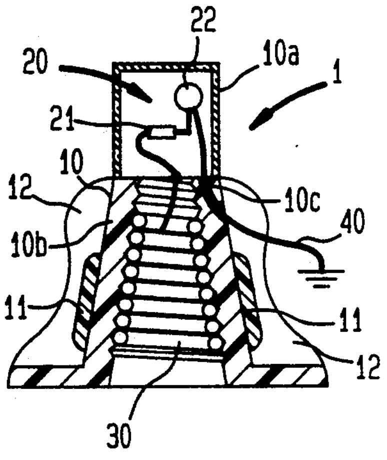
FIG. 2 is a vertical cross-sectional view of the first lighted wire connector shown in FIG. 1.

As best seen in the vertical cross-sectional view illustrated in FIG. 2, first lighted wire connector 1 further includes a tapered metal spring 30 coiled and threadedly attached to the inside surface of the lower portion 10*b* of the shell 10. Spring 30 is inwardly tapered from a lower end thereof to an upper end thereof. Light assembly 20 is connected in serial between the spring 30 and a ground potential lead wire 40. In the first lighted wire connector 1 the ground potential lead wire 40 extends from the light assembly 20 through a channel 10*c* formed in the lower portion 10*b* of the shell 10 for selective attachment to a grounding source.

The light assembly 20 in the first lighted wire connector 1 is shown to comprise a current limit resistor 21 and a bulb 22 connected in series. As should be understood by those skilled in the art, light assembly 20 could in the alternative comprise a light-emitting diode (LED) connected between the spring 30 and the ground potential lead wire 40.

Figure 3:
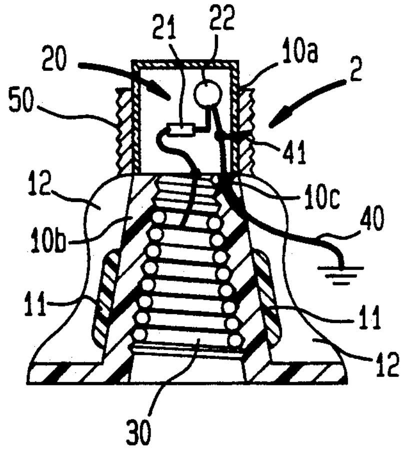
FIG. 3 is a vertical cross-sectional view of a second embodiment of the present invention.

FIG. 3 illustrates a vertical cross-sectional view of a second lighted wire connector 2 constructed in accordance with the teachings of the present disclosure. Second lighted wire connector 2 comprises a hollow plastic shell 10 having a transparent upper portion 10*a*, and finger-gripping means 11 and torquing wings 12 disposed on the lower portion 10*b* of the shell 10. Second lighted wire connector 2 further includes a plurality of metal threads 50 disposed on the outer surface of the upper portion 10*a* of the shell 10. These metal threads 50 permit threaded engagement of the second lighted wire connector 2 to a control board or the like. The metal threads 50 also function as a grounding source connection means for a light assembly 20 as hereinafter described in greater detail.

Light assembly 20 is disposed to the inside of the transparent upper portion 10*a* of shell 10 and includes a current limit resistor 21 and a bulb 22 connected in series. A tapered metal spring 30 is threadedly attached to the inside surface of the lower portion 10*b* of the shell 10. Light assembly 20 is attached to the spring 30 as heretofore described. In the second lighted wire connector 2 light assembly 20 is attached in series to a ground potential lead wire 40. A thread ground potential lead wire 41 is attached between the ground potential lead wire 40 and the metal threads 50. Second lighted wire connector 2 can thus be ground through the ground potential lead wire 40 or the thread ground potential lead wire 41.

Figure 4:
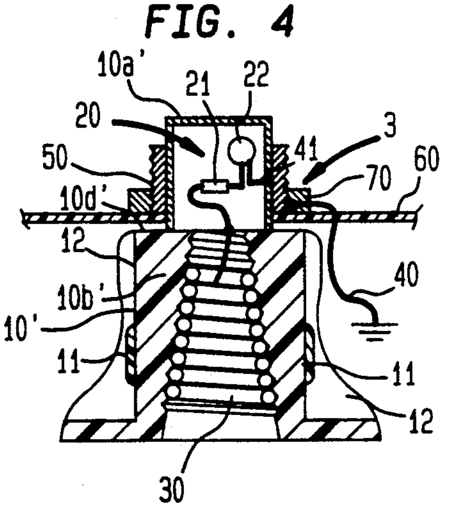
FIG. 4 is a vertical cross-sectional view of a third embodiment of the present invention.

A third embodiment of a lighted wire connector 3 is illustrated in FIG. 4. Third lighted wire connector 3 comprises a second shell 10′ having a transparent upper portion 10*a*′ and a lower portion 10*b*′. Finger-gripping means 11 and torquing wings 12 are disposed on the lower portion 10*b*′ of the second shell 10′. The lower portion 10*b*′ of second shell 10′ extends laterally from the transparent upper portion 10*a*′ to form a bearing engagement ridge 10*d*′ about the periphery of second shell 10′. Bearing engagement ridge 10*d*′ fits adjacent to the bottom face of a planar surface 60, for example a control panel, to permit the transparent upper portion 10*a*′ to extend above the surface of the control panel. Third lighted wire connector 3 further includes metal threads 50 disposed on the outer surface of the upper portion 10*a*′ of the second shell 10′.

A light assembly 20 as heretofore described is disposed to the inside of the transparent upper portion 10*a*′ of second shell 10′ and includes a current limit resistor 21 and a bulb 22 connected in series. A thread ground potential lead wire 41 is attached between the light assembly 20 and the metal threads 50. Third lighted wire connector 3 can be grounded by connection of a metal nut 70 threadedly atached to metal threads 50 and a grounded control panel 60. Alternatively, third lighted wire connector 3 can be grounded by attaching a ground potential lead wire 40 to the metal nut 70 which can in turn be attached to a remote neutral or grounding source. A tapered metal spring 30 is threadedly attached to the inside surface of the lower portion 10*b*′ of the second shell 10′. Light assembly 20 is attached to the spring 30 as heretofore described.

Figure 5:
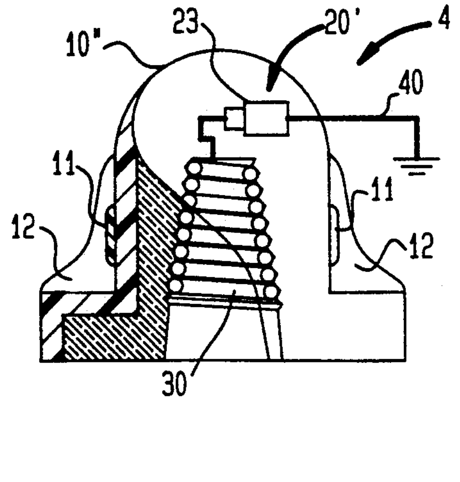
FIG. 5 is a partially cross-sectioned elevational view of a fourth embodiment of the lighted twist-on wire connector of the present invention.

A fourth embodiment of a lighted wire connector 4 is illustrated in FIG. 5. Fourth lighted wire connector 4 includes a transparent shell 10″ having a metal spring 30 threadedly attached to the inside surface of the transparent shell 10″. A second light assembly 20′ is connected in series between the metal spring 30 and a ground potential lead wire 40. Second light assembly 20′ comprises a light-emitting diode (LED) 23.

The various embodiments of a lighted twist-on wire connector described and illustrated in the several drawing figures are made operable and used in the novel troubleshooting method by engagement of the ends of two or more energized wires in the metal spring 30 as known in the prior art. The voltage drop across the energized wires energized the light assembly 20 when grounded.

Various changes and modifications may be made to the present disclosure without departing from the spirit and scope of this invention. Such changes and modifications within a fair reading of the appended claims are intended as part of the present disclosure.

Therefore, in view of the foregoing I claim:

1. A method of troubleshooting an electrical circuit comprising visually observing a voltage indicator light visibly located inside a twist-on connector directly connected to two or more wires wherein said voltage indicator light being lighted signifies the presence of voltage among said wires with respect to ground.

2. A method of detecting the presence of voltage across the ends of two or more wires with respect to ground comprising the steps of:

(a) Connecting a combination of a twist-on wire connector and a voltage indicator light disposed to the inside surface of said twist-on wire connector wherein said twist-on wire connector has a shell with a transparent portion through which said light may be observed and said shell further includes finger gripping means disposed on said shell, said combination being connected to the ends of said two or more wires;

(b) Twisting said combination onto said two or more wires by said finger gripping means disposed on said shell; and (c) Observing said light through said transparent portion of said shell whereby said light being lighted indicates the presence of voltage.

3. A method of troubleshooting an electrical circuit to determine the presence of voltage across the ends of two or more wires with respect to ground comprising the steps of:

(a) Detachably connecting a combination of a twist-on wire connector and a voltage indicator light disposed to the inside surface of said twist-on wire connector wherein said twist-on wire connector has a shell with a transparent portion through which said light may be observed and said shell further includes finger gripping means disposed on said shell, said combination being detachably connected to the ends of said two or more wires;

(b) Twisting on said combination onto said two or more wires by said finger gripping means disposed on said shell;

(c) Observing said light through said transparent portion of said shell whereby said light being lighted indicates the presence of voltage; and (d) Detaching said detachable combination from said two or more wires by said finger gripping means disposed on said shell.

* * * * *